United States Patent [19]

Fjelstad et al.

[11] Patent Number: 5,679,194

[45] Date of Patent: Oct. 21, 1997

[54] FABRICATION OF LEADS ON SEMICONDUCTOR CONNECTION COMPONENTS

[75] Inventors: Joseph Fjelstad, Sunnyvale; John W. Smith, Palo Alto, both of Calif.

[73] Assignee: Tessera, Inc., San Jose, Calif.

[21] Appl. No.: 434,552

[22] Filed: May 4, 1995

[51] Int. Cl.⁶ .................................................. H05K 3/40
[52] U.S. Cl. .................... 156/150; 29/827; 216/14; 216/20
[58] Field of Search ........................ 156/150, 151, 156/629.1, 630.1, 634.1; 29/825, 829, 846, 847, 852, 827; 427/58, 96, 97, 123; 437/220; 257/668, 735, 736; 216/7, 11, 14, 36, 43, 20

[56] References Cited

U.S. PATENT DOCUMENTS 3,024,151  3/1962  Robinson .......................... 156/150
3,129,280  4/1964  Elarde ........................... 156/150 X
3,350,498  10/1967  Leeds ........................... 156/150 X

FOREIGN PATENT DOCUMENTS

WO94/03036  2/1994  WIPO .

*Primary Examiner*—Michael W. Ball
*Assistant Examiner*—Francis J. Lorin
*Attorney, Agent, or Firm*—Lerner, David, Littenberg, Krumholz & Mentlik

[57] ABSTRACT

A substantially continuous layer of a first metal such as copper is provided with strips of a second metal such as gold by selective electroplating of the second metal. A dielectric support layer is provided in contact with the first metal layer, and the first metal layer is etched to leave strips of the first metal contiguous with the strips of the second metal, thereby providing composite leads with the first and second metal strips connected in series. The process provides simple end economical methods of making microelectronic connection components with leads having a flexible, fatigue resistant lead potion formed from a precious metal.

29 Claims, 4 Drawing Sheets

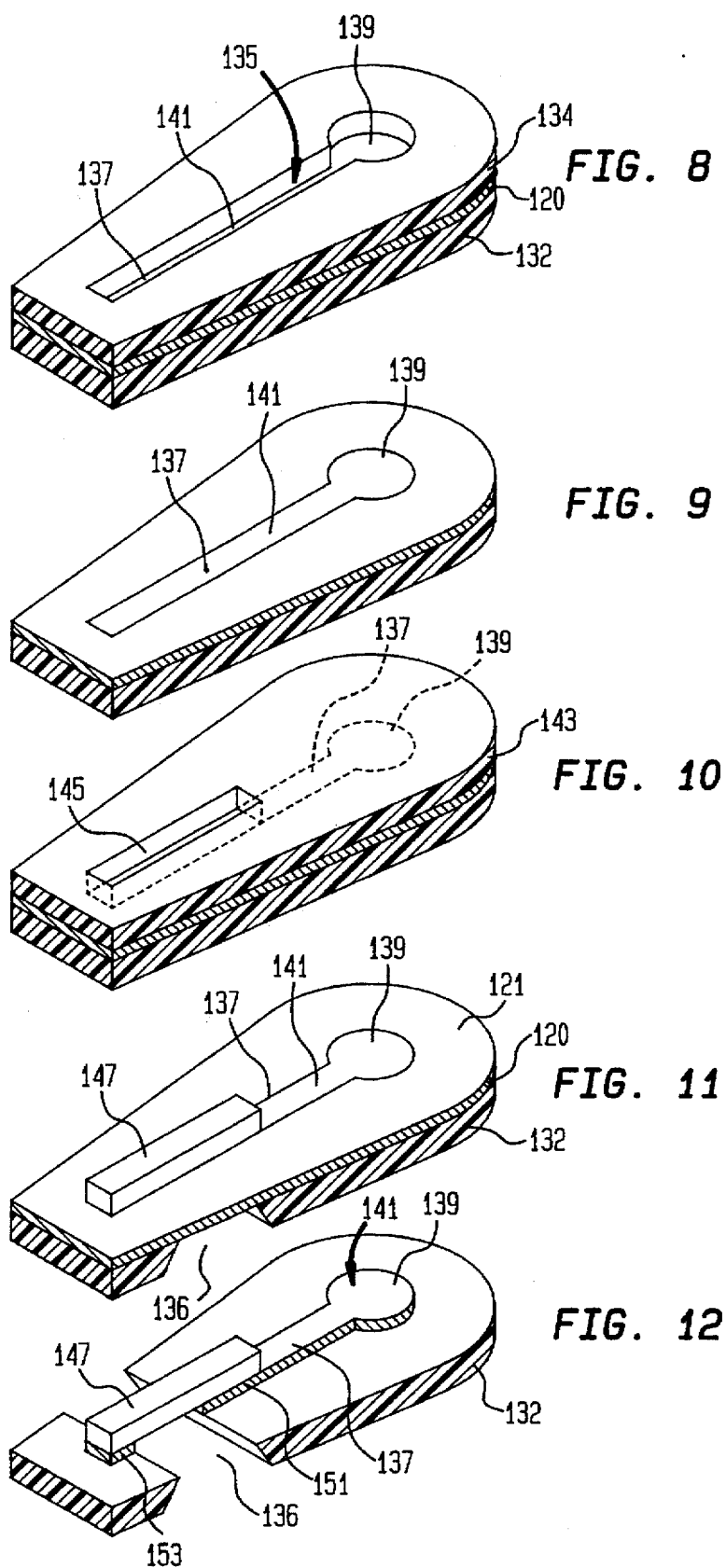

FABRICATION OF LEADS ON SEMICONDUCTOR CONNECTION COMPONENTS

FIELD OF THE INVENTION

The present invention relates to methods of making connection components for semiconductor chips and other microelectronic devices, and to the connection components made thereby.

BACKGROUND OF THE INVENTION

Microelectronic components such as semiconductor chips typically are connected to external circuits through contacts on the components as, for example, contacts on the surface of a semiconductor chip. Various processes have been proposed for connecting these contacts with circuits on an external substrate such as a circuit panel or multichip module base, In a wire bonding process, the chip is physically mounted to the substrate. A fine wire is fed through a bonding tool. The tool is engaged with a contact on the chip so as to bond the wire to the contact of the chip. The tool is then moved to a connection point on the substrate while paying out a wire through the tool, so that a small piece of wire is dispensed and formed into a lead. The tool then bonds this lead to the connection point on the substrate. This process is repeated for each contact on the chip.

In the so-called tape automated bonding or "TAB" process, a dielectric supposing tape such as a thin film of polyimide is provided with a hole slightly larger than the chip. An array of metallic leads is provided on one surface of the tape. These leads extend inwardly across the edges of the hole. The innermost ends of the leads are arranged side-by-side at spacings corresponding to the spacings of the contacts on the chip. The tape and leads are juxtaposed with the chip so that the hole is aligned with the chip and so that the innermost ends of the leads extend over the contact-bearing surface of the chip. The innermost ends of the leads are then bonded to the contacts of the chip by ultrasonic or thermalcompression bonding processes. The outer ends of the leads are connected to the external substrate.

The wire bonding and TAB processes suffer from significant drawbacks, which become more severe as the number of contacts on the chip increases and the distances between contacts on the chip decrease. For example, the TAB process encounters substantial difficulties with contact spacings less than about 100 microns. As disclosed in commonly assigned International Patent Publication WO 94/03036, the disclosure of which is hereby incorporated by reference herein, new connection methods substantially overcome these drawbacks. In preferred methods according to the '036 publication, a connection component includes a dielectric support structure such as a polyimide or other polymeric sheet defining gaps such as holes or elongated slots. Leads are provided on the support structure. Each lead has an elongated connection section extending across a gap in the support structure. A first end of each connection section is permanently secured to the support structure, and is connected to a terminal disposed on the support structure. The second end of each connection section, disposed on the opposite side of the gap, is mounted to the support structure so that such second end can be displaced downwardly relative to the support structure. For example, each lead may be provided with a frangible section such as a narrow portion, and the second end of each connection section may be attached to the support structure through the frangible section. In another arrangement also taught in the '036 publication, the second end of each connection section can be weakly bonded to the support structure. Because all of the lead connection sections are supported at both ends prior to connection to the chip, the connection sections can be positioned with good accuracy relative to the contacts on the chip by positioning the support structure on the chip. In a bonding operation, each lead desirably is engaged by a bonding tool and guided into even more precise alignment with the contact on the chip by the bonding tool itself. As each lead is bonded to a chip contact, it is forced downwardly relative to the support structure, and bent downwardly until it engages the chip contact. This action displaces the second end of the support structure. Where the second end of the connection section is detachably connected to the support structure, the downward movement of the connection section imparted by the tool breaks the attachment between the second end of the connection section and the support structure, as by rupturing the frangible section or breaking the bond between the second end of the connection section and the support structure.

Connection components and methods according to the aforementioned '036 Publication substantially overcome many of the drawbacks associated with conventional connection methods. For example, such components and methods can be used to connect chips having closely spaced contacts. Although the connection component according to the '036 Publication can be fabricated readily using the procedures described therein, still further improvement would be desirable. For example, it is particularly desirable to form the connection sections of the leads from gold or other malleable precious metals to provide enhanced flexibility and fatigue resistance in the connection sections, and to provide maximum oxidation resistance. However, for minimum cost, the other sections of the leads should be formed from less expensive metals. Also, the process used to make the leads should include the fewest possible steps. Further, although the '036 publication discloses certain arrangements in which the second end of the connection section is releasably attached to the support structure without use of a frangible section, further improvements in such non-frangible releasable connections would be desirable.

SUMMARY OF THE INVENTION

The present invention addresses these needs.

One aspect of the present invention provides methods for making a connection component for a microelectronic element. Methods according to this aspect of the invention desirably include the steps of providing a substantially continuous layer of a first metal, typically an economical, etchable base metal such as copper or a copper alloy, and selectively depositing a plurality of conductive portions of a second metal on the first metal layer. The second metal may be deposited in elongated strips, and may be a malleable precious metal such as a gold alloy or, preferably, substantially pure gold. The methods according to this aspect of the invention further include the step of providing a dielectric support juxtaposed with the first metal layer and selectively removing the first metal after selectively depositing the second metal conductive portions or strips. The selective removal forms a plurality of conductive portions from the first metal. The conductive portions of the first metal formed during the selective removal step are contiguous with the conductive portions of the second metal. The conductive portions of the second metal and first metal thus form a plurality of composite leads, each such composite lead including conductive portions of the first and second metals connected to one another. Thus, the conductive portions of the first metal formed by the selective removal step may include a plurality of elongated strips of the first metal, and the depositing and removing steps may be performed so that at least some of the composite leads include strips of the first and second metal connected in series with one another.

The process may further include the step of providing gaps in the dielectric support registered with the strips of the second metal so that the strips of the second metal extend across the gaps. Thus, the strips of the metal may constitute the connection sections of leads in an arrangement as disclosed in the '036 Publication, whereas the sections formed from the first metal may constitute the remainder of the leads. The composite leads provide the desired flexibility and fatigue resistance in an economical construction. Preferably, the selective depositing step is performed by electroplating the second metal, such as gold, unto the continuous sheet of the first metal or copper, using a mask layer with apertures corresponding to the desired locations of the second metal.

The step of selectively removing the first metal may be performed by etching the first metal layer, desirably after selectively masking the first metal layer. In certain embodiments of the invention, the entire process of forming the composite leads includes only one plating step and only one etching step. The step of providing the dielectric support may include the step of laminating the dielectric support to the first metal layer after depositing the strips of the second metal, and, preferably, before etching the first metal. The gaps may be provided in the dielectric support by providing the gaps in the support before the laminating step. The laminating step may be performed so as to align the gaps with the strips of the second metals. The method may further include the step of punching the laminated second metal and dielectric support after the laminating step but before the step of selectively removing the first metal so as to form punched holes continuous with the gaps in the support. During the punching process, the first metal layer reinforces the dielectric support so that the same may be effectively and cleanly cut by the punches. The punching operation may form holes continuous with the gaps, so that the gaps and holes are joined into a continuous slot encircling a central portion of the dielectric support structure. Alternatively, the gaps in the dielectric support can be formed after the laminating step, as by laser ablation or chemical etching. In a particularly preferred arrangement, the strips of the second metal are deposited on a first side of the first metal layer and this first side of the first metal layer faces towards the dielectric support during and after the laminating step. An adhesive may be provided between the first side of the first metal layer and the dielectric support. Thus, after the laminating step, and after the etching step as well, one end of each second-metal strip will be embedded in the adhesive and hence releasably connected to the dielectric support layer. The other end of each second metal strip will be connected to the remainder of the lead, including the first metal, and hence will be securely anchored to the dielectric support layer. Thus, the process forms the releasable connections as well with the simple plating and etching process. There is no need to form fine features which provide frangible sections in the leads, and no need for additional operations with precise process control.

In other methods according to the invention, the dielectric support and the metal layer are pre-formed so as to provide the continuous first metal layer on the dielectric support prior to the other steps of the process. The strips of the second metal are deposited on the top surface of the first metal layer, facing away from the dielectric support. A process according to this aspect of the invention may include the step of selectively depositing a thin flash layer of an etch-resistant metal in a plurality of flash regions. The step of selectively removing the first metal to form the first metal portions of the leads may include the step of exposing the first metal layer to an etchant, in which case the flash metal protects the first metal from the etchant in regions corresponding to the first metal conductive portion. Each flash region may include an elongated strip section. The step of depositing the second metal strips may include the step of depositing the second metal on such a strip section of the flash region. Thus, each flash region may be partially masked prior to depositing the second metal so as to leave at least part of the strip portion of each flash region unmasked, but mask other portions of each flash region. The process may further include the step of forming gaps in the dielectric support layer aligned with the strips of second metal after depositing such strips. After forming the gaps, the first metal layer, with the flash regions and the second metal strips thereon may be exposed to an etchant, so as to form the first metal layer into lead portions contiguous with the strips of the second metal. As in the other embodiments discussed above, the entire composite lead structure may be formed by a simple process, in this case including two plating steps and one etching step. Here again, there is no need to form a particularly fine features to make frangible sections and no need for complex sequences of operations.

These and other objects, features and advantages of the present invention will be more readily apparent from the detailed description of the embodiments set forth below, taken in conjunction with the accompanying drawings.

BRIEF DESCRIPTION OF THE DRAWINGS

FIG. 8 is a perspective view depicting a portion of a component during the process in accordance with yet another embodiment of the present invention.

FIGS. 9 through 12 are views similar to FIG. 8 but depicting the component during progressively later stages of the same process.

DETAILED DESCRIPTION OF THE PREFERRED EMBODIMENTS

Figure 1A:
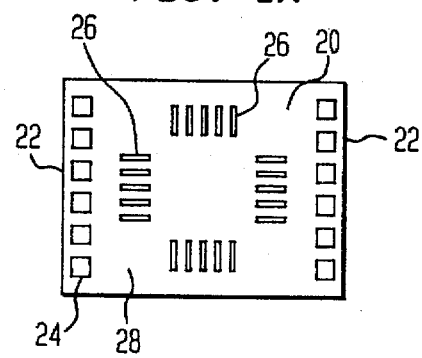
FIGS. 1a and 1b are, respectively, bottom plan and sectional views of a metal layer utilized in one embodiment of the present invention.

A process in accordance with one embodiment of the present invention begins with a layer 20 of copper. The copper desirably is between about 5 and 50 microns thick. Copper layer 20 desirably is in the form of an elongated tape having lengthwise edges 22 and having sprocket holes or alignment holes 24 extending through the layer adjacent the edges. The region of the tape between the rows of alignment holes 24 desirably is substantially continuous. As used in this disclosure with reference to a layer, the term "substantially continuous" means that the material of the layer occupies at least about 50 percent of the surface of the layer. That is, such a layer may have holes or apertures therein, but desirably the holes or apertures occupy less than half of the surface area of the layer. Most preferably, the region of layer 20 between the sprocket holes is entirely continuous and imperforate and has no holes or apertures. Only a small portion of the length of the copper tape is shown. The portion shown corresponds to the portion required to form one connection component. The copper tape typically is of indefinite running length, and incorporates many such portions.

In the first stage of the process, strips 26 of pure gold, desirably about 10 to about 50 microns thick and about 10 to about 50 microns wide are deposited on a first or top surface 28 of layer 20 by a selective electroplating process. The selective electroplating process may incorporate the steps of applying a resist, such as a common photographically patternable plating resist (not shown), onto top surface 28 and patterning the resist to provide holes at the locations where strips 26 are to be formed. A non-selective, non-patterned resist (not shown) is used to cover the entire second surface 30 of layer 20. Strips 26 are then formed by immersing the resist-covered layer 20 into a gold electroplating bath and applying an electroplating potential. Continuous layer 20 conveys the plating current to the locations of all of strips 26. Strips 26 are formed in rows disposed in a substantially rectangular array, with the strips in each row extending side-by-side and parallel with one another. Strips 26 are formed at preselected positions relative to alignment holes 22. After plating strips 26, the photoresists are removed from layer 20.

A dielectric support tape 32 is formed from a polymeric material such as a polyimide film between about 15 and about 50 microns thick, and most desirably about 25 microns thick. Tape 32 has alignment holes or sprocket holes 34 corresponding to the alignment holes 24 in first metal layer 20. Tape 32 also has a set of elongated gaps 36 extending in a generally rectangular pattern substantially surrounding a central portion 38 of the tape. The central portion 38 of the tape, however, is connected by webs 40 at the corners of the rectangular gap pattern to the peripheral region of the dielectric support layer or tape, adjacent the alignment holes 34. Gaps 36 are disposed in preselected positions relative to the alignment holes 34 in the dielectric support layer. The dielectric support layer or tape 32 is also provided with a layer of an adhesive 42 covering its top surface. Adhesive layer 42 desirably is formed from a heat-activatable, rapidly curable adhesive. For example, the adhesive can be of the type commonly referred to in the semiconductor industry as a "snap cure" adhesive. Alternatively, the adhesive may be a thermoplastic material such as polyetherimide. The thermoplastic material is adapted to soften upon application of heat, and then form a solid bond upon cooling.

In the next stage of the process, first metal layer 20 is laminated to dielectric layer 32 using heat and pressure appropriate to activate and cure adhesive 42. Alignment holes 22 and 34 in the metal and dielectric layers are engaged with an appropriate fixture (not shown) to bring these holes into registration with one another end thereby bring strips 26 into registration with gaps 36. The first side 28 of the metal layer, with strips 26 thereon faces towards the dielectric layer 32 and engages the adhesive layer 42. Thus, the adhesive layer 42 is sandwiched between first metal layer 20 and the dielectric support layer 32. Strips 26 are aligned with the gaps 36 in the polymeric layer. The ends of each strip are embedded in adhesive layer 42. Each strip 26 bridges over one gap 36, so that the ends of each such strip are positioned on dielectric layer 32. During the lamination process, the assembly is brought to a substantially planar condition as first metal layer 20 and dielectric layer 32 are pressed between opposing surfaces of the fixture. The adhesive layer may deform or flow to compensate for irregularities in the metal layer or in the polymer layer. After lamination, the assembly is punched using a conventional mechanical punch press and matched die set to form holes 48 at the corners of the rectangular gap array. Holes 48 are continuous with gaps 36 in the dielectric support layer 32, and thus form a continuous channel surrounding central region 38 of the dielectric support layer. During the punching process, metal layer 20 reinforces the dielectric layer. This facilitates formation of holes 48 without tearing or deforming the dielectric layer. Thus, all of the other features of the dielectric layer remain precisely located in their original positions.

Following the punching step, strips of a further photoresist 44 are deposited on the second surface 30 of first metal layer 20, so that each such strip 44 has an end overlying one end of a second metal or gold strip 26. Each such strip of photoresist 44 extends away from the associated gold strip 26. At the end of each strip 44 remote from the second metal or gold strip 26, there is a round head or terminal-forming spot 46. The photoresist strips are applied and patterned in the conventional manner, as by depositing a layer of photoresist, developing the resist selectively using photographic processes and removing undeveloped portions of the resist. After application of resist strips 44, the entire assembly is subjected to an etchant with attacks the copper in layer 20 but does not attack the gold in strips 26, such as a $HCl/CuCl_2$ etchant. This removes all of layer 20 except those regions of the layer covered by resist strips 44 and by terminal forming spots 46. After this etching process, resist strips 44 and spots 46 are removed by conventional resist removal processes.

Figure 4A:
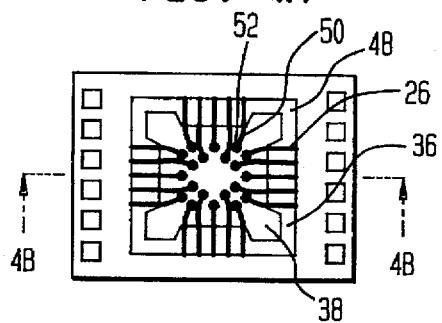
FIGS. 4a and 4b are, respectively, top plan and sectional views showing the components at a later stage in the process.
Figure 4B:
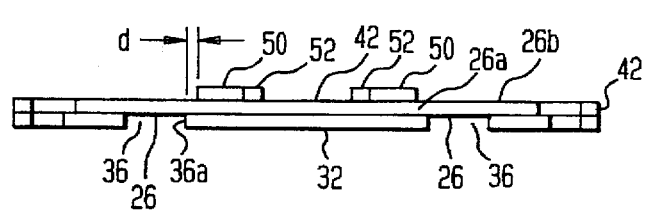
Figure 5:
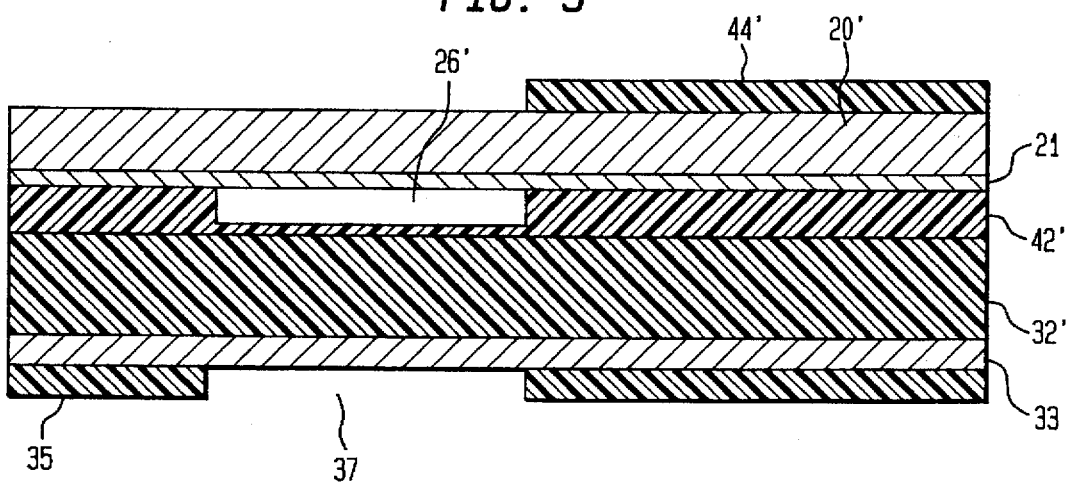
FIG. 5 is a fragmentary, diagrammatic sectional view depicting a portion of a component during a process in accordance with another embodiment of the invention.
Figure 6:
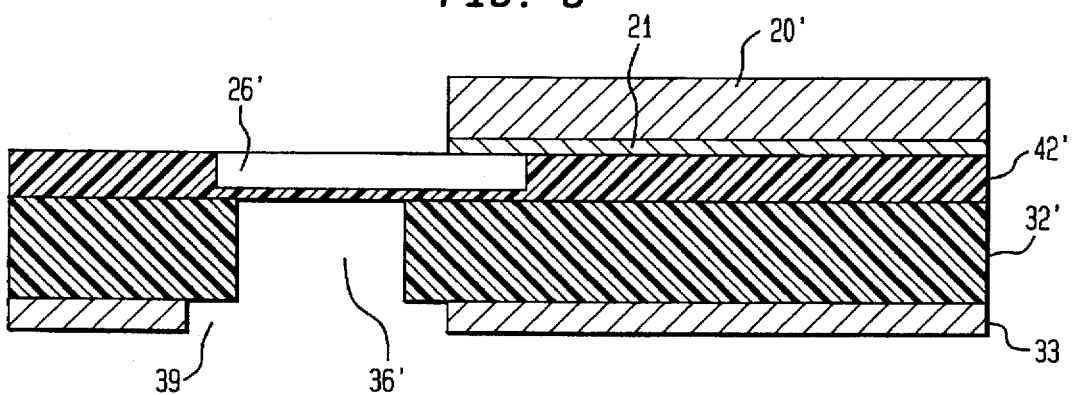
FIG. 6 is a view similar to FIG. 5 but depicting the component at a later stage in the process.

The etching process removes essentially all of the original first metal layer 20 except for individual strips or connector portions 50 and terminals 52. As seen in FIGS. 4a and 4b, each first metal or copper strip 50 is in continuous, substantially end-to-end series connection with one gold or second metal strip 26, with a small lap joint between the first metal and second metal strips. Thus, each copper strip 50 and the associated gold strip 26, form a composite lead having gold and copper portions connected in series, and having the gold portion disposed at the end of the composite lead remote from terminal 52. Each gold strip 26 is aligned with a gap 36 in the dielectric layer. The first metal connector portions or strips 50, and terminals 52 are disposed on the central portion 38 of the dielectric layer. Each gold strip or second metal strip 26 has a first end 26a connected to the associated first metal or copper strip 50. The first end 26a of each gold strip is disposed on one side of the associated gap 36 in layer 32. Each gold strip also has a second end 26b remote from the associated copper strip 50 and disposed on the opposite side of the associated gap 36. Each copper strip 50 covers a substantial area of the adhesive layer 42 and hence is securely fastened to the dielectric layer 32. The first end 26a of each gold strip is securely anchored by its metallurgical bond to the associated copper strip 50. However, the second end 26b of each gold strip 26 is only lightly anchored to the peripheral region of the dielectric layer by adhesive surrounding the end. Such adhesive grips of the second end 26b over only a minuscule area. The bond between each second end 26b is secure enough to hold the lead in place during handling and during assembly with a semiconductor chip. However, the bond at each second end 26b is readily releasable. In the finished condition illustrated in FIGS. 4a and 4b, the central region 38 of the dielectric layer is connected to the peripheral region only through the leads and, in particular, only through the connection sections or gold strips 26 of the composite leads.

The component fabricated according to the foregoing process can be utilized in connection methods as disclosed in the aforesaid International Patent Publication WO 94/03036. Thus, the connection component can be juxtaposed with a semiconductor chip (not shown) so that rows of contacts on the semiconductor chip are aligned with the gaps 36 in the dielectric layer and so that the gold strips or connection sections of the leads are aligned with contacts on the chip. A bonding tool can be advanced to engage each connection section, force the connection section downwardly into the gap and bond the connection section to the appropriate contact on the chip. As described in the '036 Publication, the bonding tool desirably brings each connection section into more precise alignment with the contact. During the downward motion, the second end 26b of the lead will be detached from the support layer 32, whereas the first end 26a will remain in place. As the leads are bonded, the central portion 38 of the dielectric layer becomes detached from the peripheral portion, so that the peripheral portion with alignment holes 26, may be removed. As further disclosed in the aforesaid '036 publication, a compliant layer (not shown) may be provided between the dielectric layer and the chip to facilitate compensation for thermal expansion and also to facilitate moveability of terminals 52 toward and away from the chip so that such vertical movement can compensate for irregularities and non-planarities during testing and assembly to other components. The completed assembly provides the benefits discussed in the '036 publication, including good compensation for thermal expansion. Such compensation is provided in part by flexure of the connection sections 26. Because the connection sections are formed from pure gold the same will remain flexible and substantially fatigue-resistant. However, because at least a portion of each composite lead is formed from the economical first metal or copper 50, the amount of gold required in the component is substantially less than that which would be required to form the entirety of each lead from gold. Additionally, the adhesive surrounding the first end 26a of each gold strip is believed to enhance the fatigue resistance of the gold strip by minimizing stress concentrations at the junctures between the strips and the dielectric support layer. To further enhance fatigue resistance of the joints between the gold strips 26 and the copper strips 50, each such joint desirably is recessed from the edge of the gap 36. Thus, the widths and positions of gaps 36 are selected so that there is a small horizontal distance d between the edge 36a of each gap and the adjacent joints between gold and copper strips. Additionally, a barrier layer of a metal such as nickel can be applied selectively at the regions where the gold strips join the copper layer in a further, brief plating operation. Such a barrier layer prevents alloying of gold and copper and thus prevents formation of brittle intermetallic compounds. The entire process is accomplished with few steps. The process can be accomplished using essentially the same equipment as is normally used for formation of conventional TAB tape.

A process according to another embodiment of the invention utilizes a first metal layer 20' which has a substantially continuous barrier sublayer 21 on the first surface thereof. First metal layer 20' may be formed from a metal such as copper or a copper alloy, whereas barrier sublayer 21 is formed from a metal such as nickel adapted to retard interaction between the first metal and the second metal such as gold. Strips 26' of a second metal such as gold are selectively deposited onto the barrier sublayer and thus deposited on the first surface of the first metal layer 42'. The first metal layer, with the strips thereon, is the laminated to the top surface of a dielectric support layer 32' using an adhesive layer 42'. Once again, strips 26' are embedded in adhesive 42'. Prior to the lamination step, a group plane metal layer 33 of an etchable metal such as copper is provided on the bottom surface of the dielectric support layer, as by plating or sputtering the ground plane metal layer onto the bottom surface. At this stage of the process, the support layer 32' does not have gaps.

After lamination of the first metal layer, strips of resist 44' are applied on the top or second surface of the first metal layer 42'. A further resist 35 is applied on the exposed surface of the group plane layer in a pattern having gaps 37 aligned with the rows of second metal strips 26'. The first metal layer 20' and barrier layer 21 are then etched using an etchant, or series of etchants, adapted to remove both the first metal and the barrier metal. For example, sulfuric acid solutions will etch both copper and nickel. The same etchant attacks ground plane metal layer 33, and cuts slots 39 in the ground plane layer. After the etching step, gaps 36' are formed by laser ablation of the support layer 32' and of adhesive layer 42'. The laser ablation step may be performed by conventional methods, such as by use of a KrF laser. The laser ablation process may be controlled with reference to fiducial marks (not shown) deposited in the same plating process as strips 26', to thereby register the gaps 36' with strips 26'. Alternatively, gaps 36' may be formed by chemically etching the dielectric, using conventional methods such as an alkaline etch. The etching step may use ground plane layer 33 as an etching mask, or may use a further photographically patterned resist. Desirably, gaps 36' are narrower than the slots 39 in the ground plane layer, so that the ends of the leads cannot contact the ground plane layer when the lead ends are bent downwardly during use of the component. The resulting component is similar to the component discussed above. However, each first metal strip formed from layer 20' includes both the copper of the principal layer and the nickel of the barrier sublayer. The barrier layer retards diffusion and other interaction between the gold and copper at the joints between first metal and second metal strips.

Figure 7:
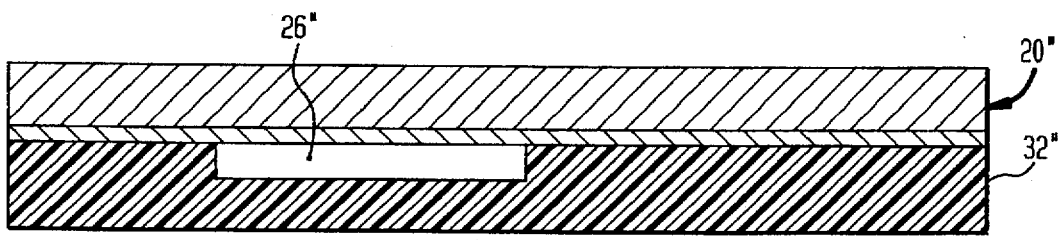
FIG. 7 is a view similar to FIG. 5 but depicting a component during a process in accordance with a further embodiment of the invention.

In a process according to a further embodiment, the second metal strips 26" are deposited on first metal layer 20" (FIG. 7) in the same manner as discussed above. After deposition of the second metal strips, the dielectric support layer 32" is formed in place on the first surface of the first metal layer 20" by coating the first surface with a flowable precursor liquid and then curing the precursor to form a cohesive layer. For example, to form a polyimide dielectric layer, the first surface of the first metal layer may be coated with polyamic acid and heat may be applied to convert the polyamic acid to polyimide. The liquid fills in around the second metal strips in much the same way as the adhesive used in other embodiments. Upon curing, the liquid bonds to the second metal strips and to the first metal layer. After curing, the dielectric layer is treated to form gaps in alignment with the second metal strips, and the first metal layer is masked and etched to form the first metal strips in the same way as discussed above. Here again, a first end of each second metal strip will be connected to a first metal strip and thus firmly fixed in place, whereas a second end of each second metal strip, on the opposite side of the gap, will be releasable held only by the bond with the cured dielectric or polyimide over the very small area at the end of the strip.

Figure 1B:
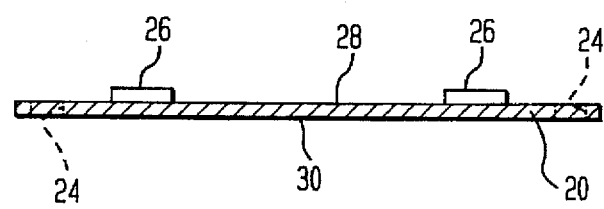
Figure 2A:
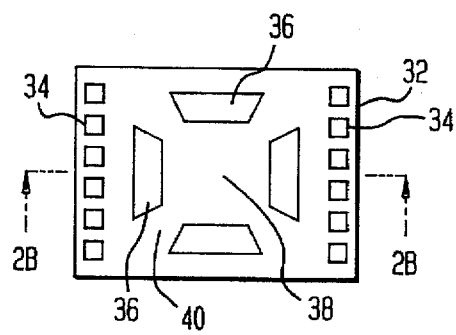
FIGS. 2a and 2b are, respectively, top plan and sectional views illustrating a dielectric support layer utilized with the metal layer of FIGS. 1a and 1b.
Figure 2B:
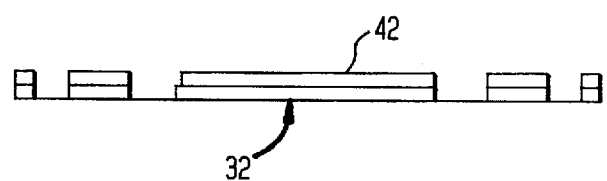
Figure 3A:
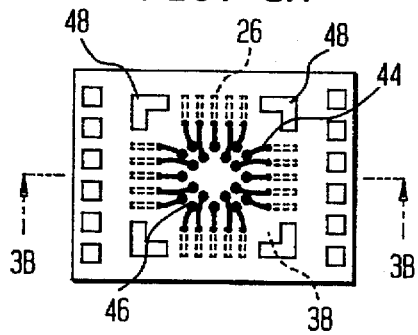
FIGS. 3a and 3b are, respectively, top plan and sectional views showing the layers of FIGS. 1 and 2 united with one another at a later stage of the process.
Figure 3B:
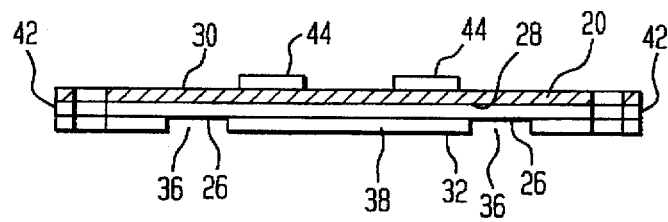

A process according to a further embodiment of the invention begins with a prelaminated assembly of a substantially continuous metal layer 120 and a substantially continuous polymeric layer 132. Only a small portion of each such layer is illustrated in FIG. 8. The layers may be provided with alignment holes (not shown) similar to those discussed above in connection in FIGS. 1–4. Metal layer 120 may be provided on dielectric layer 132 by any conventional process, such as by laminating separately formed layers using an adhesive (not shown) or by plating metal layer 120 onto the surface of dielectric layer 132. Desirably, the laminating or plating process is selected to provide relatively good adhesion between layers 120 and 132. Thus, the peel strength of layer 120 relative to layer 132 should be about 7 to 15 pounds per linear inch (about $1.2 \times 10^6$ to $2.6 \times 10^6$ dynes/cm). A first photoresist 134 is applied to the top surface 121 of layer 120, facing away from dielectric layer 132. First photoresist 134 is patterned to provide numerous openings 135, each defining an elongated strip-like portion 137 and a spot or terminal portion 139. Although only one such opening 135 is shown, it should be appreciated that numerous such openings are formed, desirably in a rectangular pattern similar to the patterns of the strips shown in FIG. 1. A very thin coating or "flash" of an etch resistant metal 141, typically less than one micron thick, is applied in each opening 135 by a brief plating process. Metal 141 desirably is gold, or a barrier metal such as nickel which will retard diffusion of gold and copper. Here again, the continuous metal layer 120 provides electrical continuity for plating of all of the flash layers. The resulting flash regions have the same shape as openings 135; each includes an elongated strip-like portion 137 and a terminal spot 139.

Resist 134 is then stripped and a further resist 143 is applied on the top surface of layer 120. Resist 143 covers the terminal region 139 of each flash region and also covers a portion of the elongated strip region 137 of each flash layer. However, resist 143 has openings 145 aligned with portions of each strip-like region 137 remote from the terminal spot 139. After application of the resist, the assembly is immersed in a gold electroplating bath and gold strips 147, similar to the gold strips discussed above, are formed in the areas aligned with holes 135. Once again, the continuous metal layer 120 conveys the plating current to all of the areas undergoing electroplating.

Following formation of gold strips 147, slots or gaps 136 are formed in dielectric layer 132 by a selective removal process such as laser ablation or alkaline etching. Slots 136 are aligned with gold strips 147. Before or after formation of slots 136, resist 143 is removed. At this stage of the process, part of each flash region 141 remains exposed on the top surface 121 of metal layer 120. Each such exposed portion includes a part of the strip-like region 137 as well as the terminal region 139. Each strip-like region 137 is contiguous with one thick gold strip 147.

In the next stage of the process, the entire assemblage is immersed in an etchant which attacks the copper of layer 120 but which does not attack the gold of flash layer 141 or of strips 147. Here again, the etchant may be a HCl/CuCl$_2$ solution. The etch removes essentially all of layer 120 except those regions disposed between flash regions 141 or strips 147 and the dielectric layer 132. Thus, the copper layer remains in each strip region 137 and in each terminal 139. Also, a small portion 151 of the copper layer remains in the region underlying the first end of each gold strip 147, adjacent strip region 137. Each gold strip is thus contiguous with each such portion 151 and with the copper in elongated strip 137 and terminal 139. Also, a small portion of the copper layer remains in the region 153 underlying each strip at its end remote from the copper strip 137. However, the copper layer is removed in the regions aligned with gaps 136 in the dielectric layer 132. Thus, the connection section of the lead—the portion aligned with gap 136—consists essentially of pure gold. The portion 153 of the lead at the tip or second end of connection section 147 has such a small area that it can be readily detached from dielectric layer 132 when the connection section 147 is forced downwardly during use.

The process according to this embodiment thus also forms composite leads with only a few, relatively simple process steps. Strip portions 137 are composed essentially of the first metal or copper. The minor amount of gold present in the flash layer on these sections has a negligible effect on the cost of the assembly.

Figure 13:
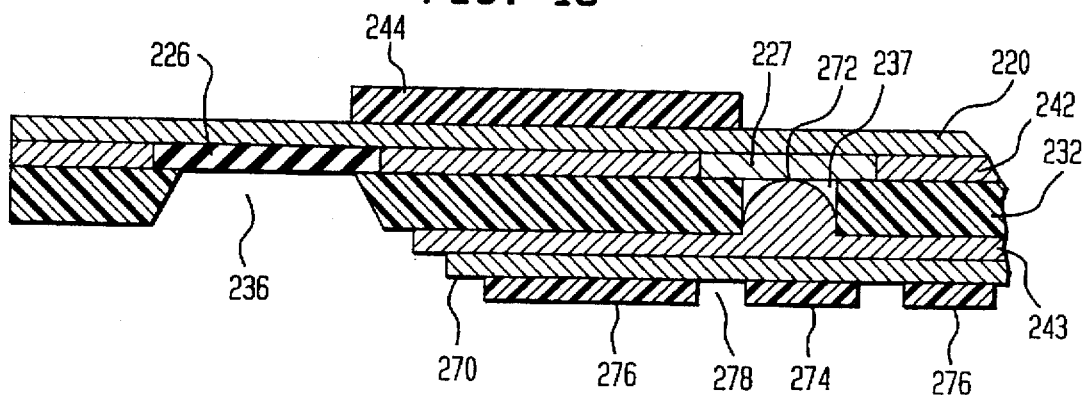
FIG. 13 is a fragmentary sectional view depicting a component during a process according to a further embodiment of the invention.
Figure 14:
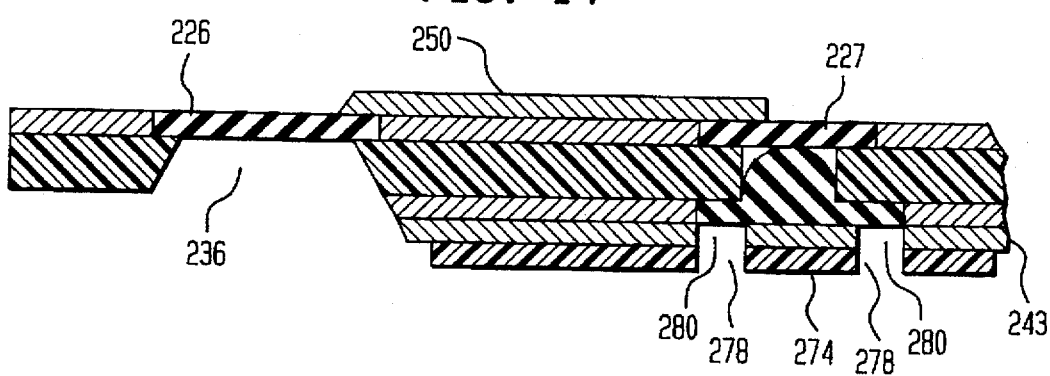
FIG. 14 is a view similar to FIG. 13 but depicting the component during a later stage of the same process.

In a further embodiment of the process, the dielectric support layer 232 (FIG. 13) is provided with an adhesive layer 242 on its top surface as discussed above with reference to FIGS. 1–4. In this embodiment, the dielectric layer is also provided with a further adhesive layer 243 on the opposite, bottom surface. In addition to the gaps 236, the dielectric layer is provided with numerous holes 237, of which only one is visible in FIG. 13. The first metal layer 220 is provided with gold strips 226 similar to the gold strips discussed above. In this arrangement, however, the gold plating process also forms connector spots 227. The first metal layer is laminated to the dielectric layer in the same manner as described above. In this lamination step, connector spots 227 are aligned with holes 237, whereas the gold strips are again aligned with the gaps 236.

A further etchable metal layer 270 is provided. Layer 270 has bonding bumps 272 disposed on a first side of the layer. Bumps 272 can be formed by plating or by patterned deposition of a solder paste or similar material. Bumps 272 are composed of a material adapted to bond with the gold in spots 227, such as a solder or tin or other metal adapted to form a eutectic with gold. Bumps 272 are disposed in a pattern corresponding to the pattern of holes 237. Further metal layer 270 also has terminal spots 274 on the second side of the layer, and a ground pattern 276 surrounding the terminal spots but separated therefrom by gaps 278. The terminal spots and ground pattern may be formed from an etch-resistant metal such as gold.

Further metal layer 272 is laminated to the dielectric layer 232 in the same lamination step as first metal layer 220. During this lamination step, the further metal layer 272 is bonded to dielectric layer 232 by adhesive 243. At the same time, bumps 272 enter holes 237 and engage connection spots 272. Bumps 272 form metallurgical bonds with the connection spots. After the lamination process strips of a resist 244 are applied on the surface of first metal layer 220 facing away from the dielectric layer. The assembly is then etched. The etchant again removes the first metal layer except in the regions covered by resist 244, leaving strips 250 of the first metal or copper connecting each gold or second metal strip 226 with one connection spot 227, and thereby forming composite leads. At the same time, the etchant attacks further metal layer at the gaps 278 in the ground pattern. This action from gaps 280 in layer 243, thereby electrically isolating each terminal spot 274 from the ground pattern. The resulting component thus has each composite lead connected to a terminal spot on the opposite side of the dielectric layer. In a further variant, bumps 272 can be replaced by deformable contacts. For example, deformable contacts such as those disclosed in commonly assigned, copending U.S. patent application Ser. No. 08/277, 336 filed Jul. 19, 1994 may be used. The disclosure of said '336 application is hereby incorporated by reference herein.

As numerous variations and combinations of the features described above may be utilized without departing from the invention, the foregoing description of the preferred embodiments should be understood as merely illustrating the invention as defined in the claims, rather than as limiting the invention.

What is claimed is:

1. A method of making a connection component for a microelectronic element comprising the steps of:

(a) providing a substantially continuous layer of a first metal;

(b) selectively depositing a plurality of conductor portions of a second metal on said first metal layer;

(c) providing a dielectric support juxtaposed with said continuous layer of said first metal;

(d) selectively removing said first metal from said layer of said first metal after said selective depositing step to form a plurality of conductor portions of said first metal contiguous with said conductor portions of said second metal and thereby form a plurality of composite leads each including conductor portions of said first and second metals connected to one another, each said conductor portion of said first metal consisting essentially of a portion of said layer of said first metal.

2. A method as claimed in claim 1 wherein said conductor portions of said second metal include a plurality of elongated strips of said second metal.

3. A method as claimed in claim 2 wherein said conductor portions of said first metal include a plurality of elongated strips of said first metal, said depositing and removing steps being performed so that at least some of said composite leads include elongated strips of said first and second metals connected substantially end-to-end with one another.

4. A method as claimed in claim 3 wherein each said strip of said second metal is positioned at an end of the composite lead.

5. A method as claimed in claim 3 further comprising the step of providing gaps in said dielectric support registered with said strips of said second metal so that said strips of said second metal extend across said gaps.

6. A method as claimed in claim 5 wherein said step of providing a dielectric support includes the step of laminating said dielectric support to said first metal layer after said step of selectively depositing said strips of said second metal.

7. A method as claimed in claim 6 wherein said step of providing said gaps in said dielectric support includes the step of providing said gaps in said support before said laminating step and aligning said gaps with said strips of said second metal during said laminating step.

8. A method as claimed in claim 7 further comprising the step of punching said second metal and said dielectric support after said laminating step and before said step of selectively removing so as to form punched holes continuous with said gaps in said support and thereby subdivide said support into a central portion and a peripheral portion, whereby said metal layer will reinforce said dielectric support during said punching step.

9. A method as claimed in claim 6 wherein said strips of said second metal are deposited on a first side of said first metal layer and said first side of said metal layer faces toward said dielectric support in said laminating step.

10. A method as claimed in claim 9 further comprising the step of providing an adhesive between said first side of said first metal layer and said dielectric support, whereby ends of said second metal strips adjacent said gaps will be embedded in said adhesive after said laminating step.

11. A method as claimed in claim 9 further comprising the step of selectively applying a mask on a second side of said first metal layer so as to provide said mask in areas corresponding to said conductor portions of said first metal, said step of selectively removing said first metal including the step of exposing said first metal layer to an etchant, said mask protecting said first metal in said areas during such exposure.

12. A method as claimed in claim 11 wherein said step of applying said mask is performed after said laminating step.

13. A method as claimed in claim 5 wherein said step of providing said dielectric support layer includes the step of applying a liquid precursor on said first surface of said first metal layer after said step of depositing said strips of said second metal and then curing said precursor to form said dielectric support layer, said step of providing said gaps in said support layer including the step of removing portions of said support layer in registry with said strips of said second metal.

14. A method as claimed in claim 2 wherein said steps of providing said dielectric support and said metal layer are performed so as to provide said metal layer on said dielectric support prior to said selective depositing and selective removal steps, said step of depositing said strips of said second metal including the step of depositing said strips on a top surface of said metal layer facing away from said dielectric support.

15. A method as claimed in claim 14 further comprising the step of applying a mask to said first surface of said first metal layer, said mask having gaps in regions to be occupied by said strips of said second metal, said step of selectively applying said second metal including the step of electroplating said second metal in said gaps.

16. A method as claimed in claim 15 further comprising the steps of selectively depositing a flash layer of an etch-resistant metal in a plurality of flash regions, said step of selectively removing said first metal including the step of exposing said first metal layer to an etchant, said flash metal protecting said first metal from said etchant in regions corresponding to said conductor portions of said first metal.

17. A method as claimed in claim 16 wherein each said flash region includes an elongated strip section, said step of depositing said second metal strips including the step of depositing said second metal on said strip section of each said flash region.

18. A method as claimed in claim 14 further comprising the step of forming gaps in said dielectric support layer aligned with said strips of said second metal after said step of depositing said strips.

19. A method as claimed in claim 1 wherein said step of depositing said second metal is performed by electroplating said second metal onto said first metal layer.

20. A method as claimed in claim 1 wherein said second metal is selected from the group consisting of gold and gold alloys.

21. A method as claimed in claim 20 wherein said first metal layer includes a metal selected from the group consisting of copper and copper alloys.

22. A method as claimed in claim 21 wherein said first metal layer has a sublayer of a barrier metal on said first surface thereof, said second metal being deposited on said sublayer of said barrier metal, whereby said barrier metal is interposed between said second metal and said first metal, said barrier metal being adapted to resist diffusion of gold therethrough.

23. A method as claimed in claim 1 further comprising the step of forming vias extending through said dielectric support layer in registry with said composite leads.

24. A method as claimed in claim 23 wherein said composite leads are formed on a top surface of said dielectric layer, the method further comprising the step of forming terminals on a bottom surface of said dielectric layer and electrically connecting said terminals to said composite leads through said vias.

25. A method as claimed in claim 24 wherein said step of forming terminals on said bottom surface includes the steps of laminating a further metal sheet to said bottom surface of said dielectric layer and etching said further metal sheet to form individual terminals, said step of connecting said terminals to said composite leads including the step of connecting said sheet to said first metal layer through said vias.

26. A method as claimed in claim 25 wherein said step of connecting said further metal sheet to said first metal layer is performed during said lamination step.

27. A method as claimed in claim 5 wherein said steps of removing said first metal and providing said gaps in said dielectric support are conducted so that said elongated strips of said first metal do not extend into said gaps.

28. A method as claimed in claim 27 wherein said second metal is selected from the group consisting of gold and gold alloys.

29. A method as claimed in claim 28 wherein said first metal layer includes a metal selected from the group consisting of copper and copper alloys.

* * * * *

UNITED STATES PATENT AND TRADEMARK OFFICE
CERTIFICATE OF CORRECTION

PATENT NO. : 5,679,194

DATED : October 21, 1997

INVENTOR(S) : Fjelstad et al.

Page 1 of 2

It is certified that error appears in the above-identified patent and that said Letters Patent is hereby corrected as shown below:

Title page, Abstract, line 8, after "simple" change "end" to read --and--.

Title page, Abstract, line 11, after "lead" change "potion" to read --portion--.

Column 1, line 29, after "dielectric" change "supposing" to read --supporting--.

Column 2, line 22, after "'036" change "Publication" to read --publication--.

Column 2, line 27, after "'036" change "Publication" to read --publication--.

Column 3, line 11, after "'036" change "Publication" to read --publication--.

Column 4, line 25, after delete "a".

Column 5, line 67, after "another" change "end" to read --and--.

Column 6, line 19, after "surrounding" insert --the--.

Column 6, line 52, after "26" delete the comma.

Column 7, line 4, after "grips" delete "of".

UNITED STATES PATENT AND TRADEMARK OFFICE
CERTIFICATE OF CORRECTION

PATENT NO. : 5,679,194
DATED : October 21, 1997
INVENTOR(S) : Fjelstad et al.

It is certified that error appears in the above-identified patent and that said Letters Patent is hereby corrected as shown below:

Column 7, line 26, before "the bonding" change "Publication" to read --publication--.

Column 8, line 12, after "layer" change "42'" to read --20'--.

Column 8, line 13, before "laminated" delete. "the".

Column 8, line 24, after "layer" change "42'" to read --20'--.

Column 10, line 51, after "278" change "," to a period.

Column 10, line 62, after "layer" delete the period, insert a comma and change "The" to read --the--.

Column 11, line 2, after "action" change "from" to read --forms--.

Signed and Sealed this

Fifth Day of May, 1998

Attest:

BRUCE LEHMAN

Attesting Officer

Commissioner of Patents and Trademarks